(12) United States Patent
Greenlee et al.

(10) Patent No.: US 11,818,968 B2
(45) Date of Patent: Nov. 14, 2023

(54) CONDUCTIVE INTERCONNECTS SUITABLE FOR UTILIZATION IN INTEGRATED ASSEMBLIES, AND METHODS OF FORMING CONDUCTIVE INTERCONNECTS

(71) Applicant: Micron Technology, Inc., Boise, ID (US)

(72) Inventors: Jordan D. Greenlee, Boise, ID (US); Tao D. Nguyen, Boise, ID (US); John Mark Meldrim, Boise, ID (US); Aaron K. Belsher, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 101 days.

(21) Appl. No.: 17/410,591

(22) Filed: Aug. 24, 2021

(65) Prior Publication Data

US 2021/0384422 A1    Dec. 9, 2021

Related U.S. Application Data

(62) Division of application No. 16/382,026, filed on Apr. 11, 2019, now Pat. No. 11,127,899.

(51) Int. Cl.
| | |
|---|---|
| *G11C 5/06* | (2006.01) |
| *H10N 70/00* | (2023.01) |
| *G11C 13/00* | (2006.01) |
| *H10B 63/00* | (2023.01) |
| *H10N 70/20* | (2023.01) |

(52) U.S. Cl.
CPC ......... *H10N 70/823* (2023.02); *G11C 13/004* (2013.01); *G11C 13/0028* (2013.01); *H10B 63/80* (2023.02); *H10N 70/061* (2023.02); *H10N 70/882* (2023.02); *H10N 70/231* (2023.02)

(58) Field of Classification Search
CPC .. H10N 70/823; H10N 70/061; H10N 70/882; H10B 63/80; G11C 13/0028; G11C 13/004
See application file for complete search history.

(56) References Cited

U.S. PATENT DOCUMENTS

| | | | |
|---|---|---|---|
| 5,187,120 A | 2/1993 | Wang | |
| 5,654,233 A * | 8/1997 | Yu | ............ H01L 21/76877 438/653 |
| 5,776,830 A * | 7/1998 | Sumi | ............ H01L 21/76855 438/653 |
| 6,670,267 B2 | 12/2003 | Fortin | |
| 9,390,970 B2 * | 7/2016 | Chiang | ............ H01L 21/76879 |

(Continued)

*Primary Examiner* — Tuan T Nguyen
(74) *Attorney, Agent, or Firm* — Wells St. John P.S.

(57) ABSTRACT

Some embodiments include an integrated assembly having an insulative mass over a conductive base structure. A conductive interconnect extends through the insulative mass to an upper surface of the conductive base structure. The conductive interconnect includes a conductive liner extending around an outer lateral periphery of the interconnect. The conductive liner includes nitrogen in combination with a first metal. A container-shaped conductive structure is laterally surrounded by the conductive liner. The container-shaped conductive structure includes a second metal. A conductive plug is within the container-shaped conductive structure. Some embodiments include methods of forming conductive interconnects within integrated assemblies.

22 Claims, 9 Drawing Sheets

(56) References Cited

U.S. PATENT DOCUMENTS

| | | | |
|---|---|---|---|
| 9,899,258 B1* | 2/2018 | Wu | H01L 21/76843 |
| 10,497,607 B2* | 12/2019 | Chen | H01L 21/76804 |
| 11,162,170 B2* | 11/2021 | Ritchie | H01J 37/3464 |
| 2005/0285269 A1 | 12/2005 | Cao | |
| 2014/0273451 A1 | 9/2014 | Wang | |
| 2019/0348417 A1* | 11/2019 | Yokoyama | H01L 27/0605 |
| 2021/0391343 A1* | 12/2021 | Mutch | H10B 53/10 |
| 2022/0059693 A1* | 2/2022 | Nakamura | H01L 29/1037 |

* cited by examiner

CONDUCTIVE INTERCONNECTS SUITABLE FOR UTILIZATION IN INTEGRATED ASSEMBLIES, AND METHODS OF FORMING CONDUCTIVE INTERCONNECTS

RELATED PATENT DATA

This patent resulted from a divisional of U.S. patent application Ser. No. 16/382,026, filed Apr. 11, 2019, the disclosures of which are hereby incorporated herein by reference.

TECHNICAL FIELD

Conductive interconnects suitable for utilization in integrated assemblies, and methods of forming conductive interconnects.

BACKGROUND

There are many uses for conductive interconnects in integrated assemblies. For instance, conductive interconnects may be utilized to couple wordlines of a memory array with wordline driver circuitry, and/or to couple bitlines of the memory array with sense amplifier circuitry.

Problems may be encountered during the fabrication of conductive interconnects. For instance, keyholes (i.e., voids) may problematically form in the conductive interconnects, and may increase resistivity (i.e., reduce conductivity) of the conductive interconnects. As another example, it may be difficult to form a conductive interconnect over a copper-containing base due to the copper being problematically exposed to etching conditions during the formation of the conductive interconnect. The etching conditions may alter the copper-containing base and undesirably increase resistance (i.e., decrease conductance).

It is desired to develop new conductive interconnects, and to develop new methods of forming conductive interconnects.

BRIEF DESCRIPTION OF THE DRAWINGS

FIG. 2H-1 is a top view of the conductive interconnect of FIG. 2H.

DETAILED DESCRIPTION OF THE ILLUSTRATED EMBODIMENTS

Some embodiments include new methods of fabricating conductive structures in which wet etching with ammonium-hydroxide-containing etchant is utilized to selectively remove metal-containing material relative to metal-nitride-containing material. The resulting conductive structures may be utilized as electrical interconnects. In some embodiments, the electrical interconnects may be utilized to couple circuitry (e.g., sense/access lines) within one tier of a multitier assembly with other circuitry (e.g., wordline drivers, sense amplifiers, etc.) within another tier of the multitier assembly. Example embodiments are described with reference to FIGS. 1-5.

Figure 1A:
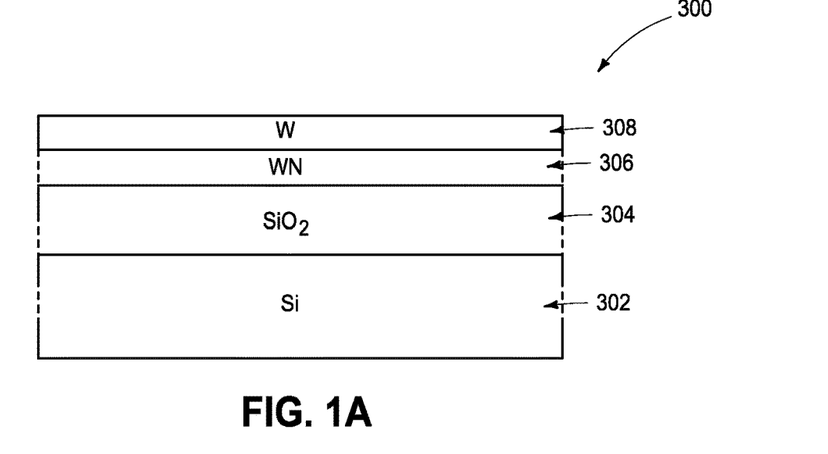
FIGS. 1A-1C are diagrammatic cross-sectional side views of an assembly at example process stages of an example method for etching and depositing metal.
Figure 1B:
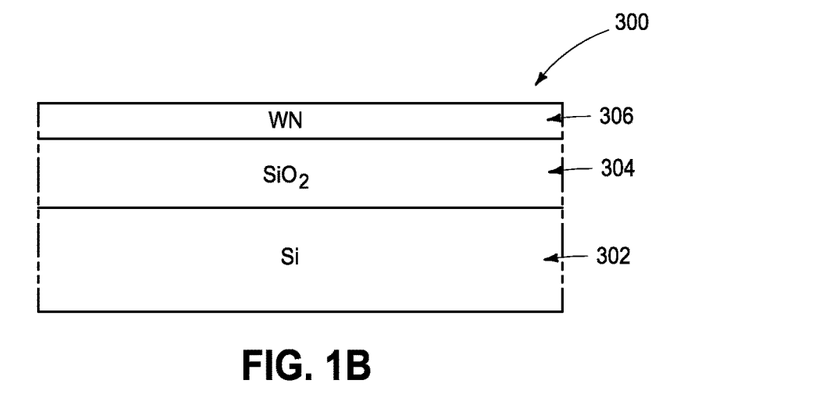
Figure 1C:
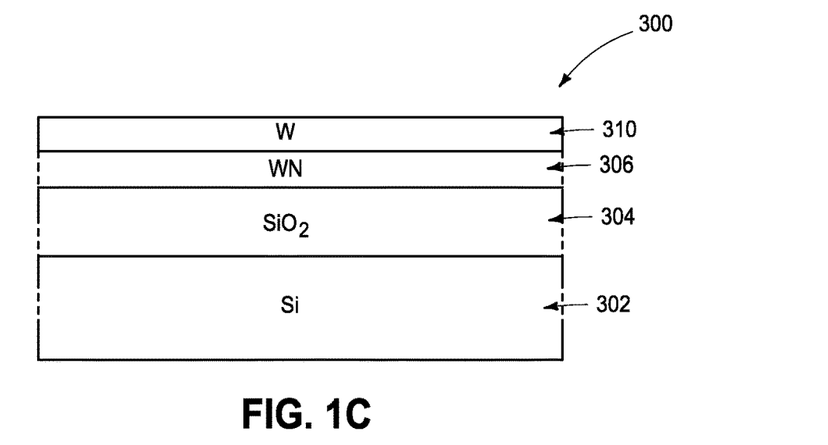

FIGS. 1A-1C are utilized to describe an example process in which a metal-containing material is selectively removed relative to an underlining liner, and in which additional metal-containing material is then redeposited over the liner.

Referring to FIG. 1A, an assembly (construction, arrangement, etc.) 300 includes a semiconductor base 302. The base 302 supports an insulative layer 304, a liner 306, and a metal-containing material 308.

The base 302 is shown to comprise silicon (Si). The base 302 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. The silicon of the base 302 may be in any suitable form; and may, for example, comprise monocrystalline silicon, polycrystalline silicon, etc.

The insulative layer 304 is shown to comprise silicon dioxide ($SiO_2$). In other embodiments, the insulative layer 304 may comprise other suitable electrically insulative compositions.

The liner 306 is shown to comprise tungsten nitride (WN). The tungsten nitride is an example of a material comprising metal and nitrogen. Generally, the liner 306 may comprise any suitable material comprising metal and nitrogen; and in some embodiments may include one or more of TaSiN (tantalum silicon nitride), TaN (tantalum nitride), TiSiN (titanium silicon nitride), TiN (titanium nitride), WN (tungsten nitride) and WSiN (tungsten silicon nitride), etc., where the chemical formulas indicate components and not specific stoichiometries.

The metal-containing material 308 is shown to comprise tungsten (W), and accordingly comprises a metal in common with the liner 306. In other embodiments, the metal within the metal-containing material 308 may be different than the metal within the liner 306. The metal within the material 308 may be any suitable metal; and in some embodiments may include one or more of tungsten (W), tantalum (Ta), titanium (Ti), etc.

Referring to FIG. 1B, the metal-containing material 308 is selectively removed relative to the liner 306. For purposes of interpreting this disclosure and the claims that follow, a first material is considered to be "selectively removed" relative to a second material if the first material is removed faster than the second material, which can include, but is not limited to, methodologies which are 100% selective for the first material relative to the second material.

The selective removal of the metal-containing material 308 relative to the metal-nitride-containing material 306 may be accomplished utilizing wet etching, with an etchant comprising ammonium hydroxide ($NH_4OH$). In some embodiments, the etchant may consist of, or consist essentially of, ammonium hydroxide and water. The concentration of the ammonium hydroxide within the etchant may be at least about 2 weight percent (wt %); and in some embodiments may be within a range of from about 10 wt % to less than or equal to about 90 wt %. In some embodiments, the etchant may be formed by mixing a stock solution of ammonium hydroxide (29 wt % in water) with water. The ratio of water to stock solution may be, for example, 5:1, 50:1, 100:1, 2000:1, etc.

In some embodiments, the etchant and the metal-containing material 308 may be at a temperature of at least about 50° C. during the selective etching of the metal-containing material 308, a temperature of at least about 55° C. during the selective etching of the metal-containing material 308, a temperature of at least about 60° C. during the selective etching of the metal-containing material 308, a temperature of at least about 65° C. during the selective etching of the metal-containing material 308, etc.

In some applications it is found that increased nitrogen concentration within the liner 306 renders the liner less susceptible to attack during the etching utilized to remove the metal-containing layer 308. In some embodiments, the liner 306 will comprise a concentration of nitrogen which is at least about 20 atomic percent (at %), at least about 30 at %, etc. In some embodiments, the nitrogen concentration will be within a range of from at least about 10 at % to less than or equal to about 75 at %.

The liner 306 may comprise, consist essentially of, or consist of a combination of metal and nitrogen. Alternatively, the liner may include other constituents (for instance, one or both of argon and boron) in addition to the metal and nitrogen. The argon may be incorporated from "flow gas" utilized during a deposition process. The boron may be provided as $B_2H_6$ to enhance nucleation of the tungsten-containing material (or other suitable material) 308 during deposition of such material onto the liner 306.

Referring to FIG. 1C, tungsten (or any other suitable metal-containing material) may be deposited over the liner 306 to form a second metal-containing material 310 over the liner 306. The second metal-containing material 310 may replace at least part of the first metal-containing material 308.

The processing of FIGS. 1A-1C may be utilized to form conductive interconnects. An example process of forming an example conductive interconnect is described with reference to FIGS. 2A-2H.

Figure 2A:
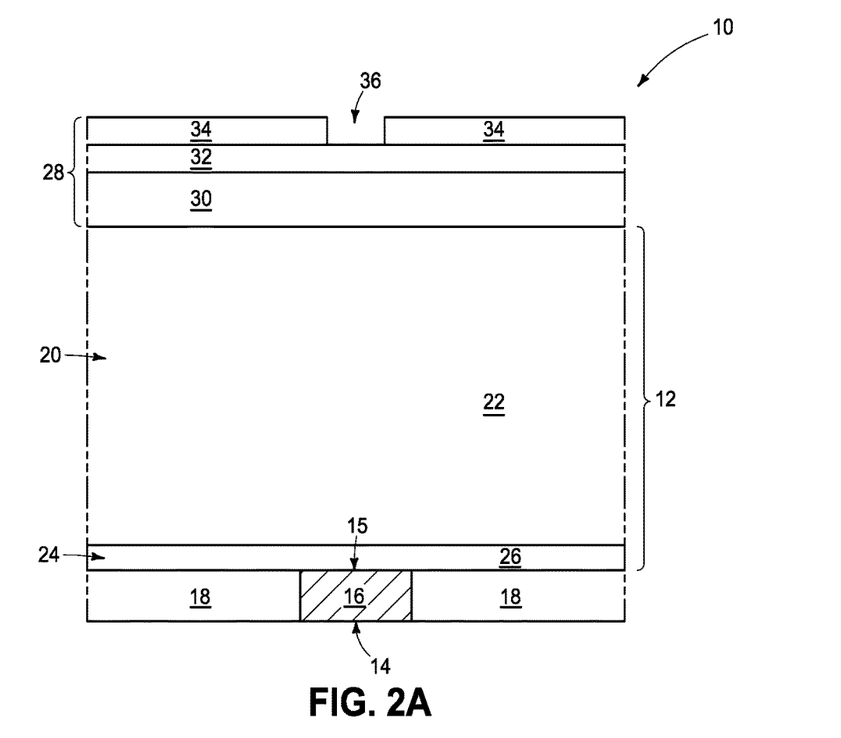
FIGS. 2A-2H are diagrammatic cross-sectional side views of an integrated assembly at example process stages of an example method for forming a conductive interconnect.

Referring to FIG. 2A, an assembly (construction, arrangement, etc.) 10 includes an insulative mass 12 over a conductive base structure 14.

The conductive base structure 14 comprises a conductive material (base material) 16. The conductive material 16 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 16 may comprise, consist essentially of, or consist of one or both of tungsten and copper.

The conductive base structure 14 extends through an insulative material 18. The material 18 may comprise any suitable composition(s); and in some embodiments may comprise, consist essentially of, or consist of silicon dioxide.

The conductive base structure 14 has an upper surface 15.

The insulative mass 12 includes an upper region 20 comprising a first material 22, and a lower region 24 comprising a second material 26.

The first material 22 of the upper region 20 may comprise any suitable composition(s); and in some embodiments may comprise, consist essentially of, or consist of silicon dioxide.

The lower region 24 is an optional region which may be utilized in applications in which the conductive base 14 comprises copper. The material 26 of the optional region 24 may comprise a composition suitable to block copper migration; and in some embodiments may comprise, consist essentially of, or consist of a combination of silicon and carbon (e.g., silicon carbide).

Masking materials 28 are over the insulative mass 12, and are utilized to define an opening which will be etched through the mass 12. The materials 28 may include a carbon-containing material 30, an antireflective coating 32 (e.g., a deposited antireflective coating, DARC), and a photoresist 34.

An opening 36 has been patterned in the photoresist 34. The opening may be formed utilizing a photolithographic process.

Figure 2B:
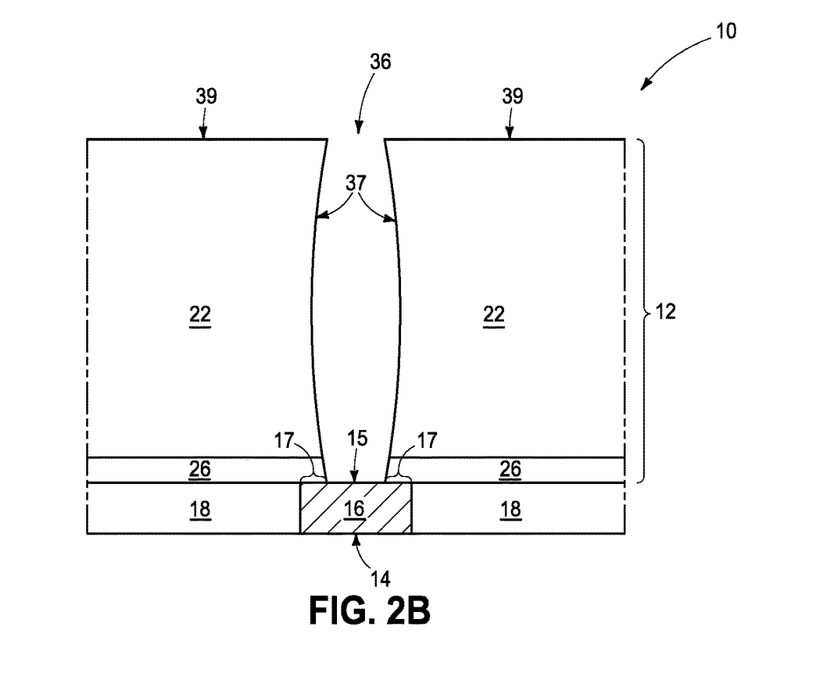

Referring to FIG. 2B, the opening 36 is extended through the insulative mass 12 to expose the upper surface 15 of the base structure 14, and then the masking materials 28 (FIG. 2A) are removed to leave an exposed upper surface 39 of the insulative mass 12.

In the shown embodiment, only a portion of the upper surface 15 of the base structure 14 is exposed within the opening 36, and other portions 17 of the upper surface 15 remain covered by the material 26 of the insulative mass 12.

The illustrated opening has bowed sidewalls 37. In other embodiments, the sidewalls may have other configurations; and may be straight, tapered, etc. The illustrated bowed sidewalls may provide particular difficulties for conventional fabrication processes in that the bowed sidewalls may problematically lead to seams (keyholes) or other undesired structures. Accordingly, the bowed sidewalls 37 are utilized to show particular advantages which may be achieved utilizing processing described herein. It is to be understood, however, that the processing described herein may be applied to other configurations besides those specifically illustrated in this disclosure.

Figure 2C:
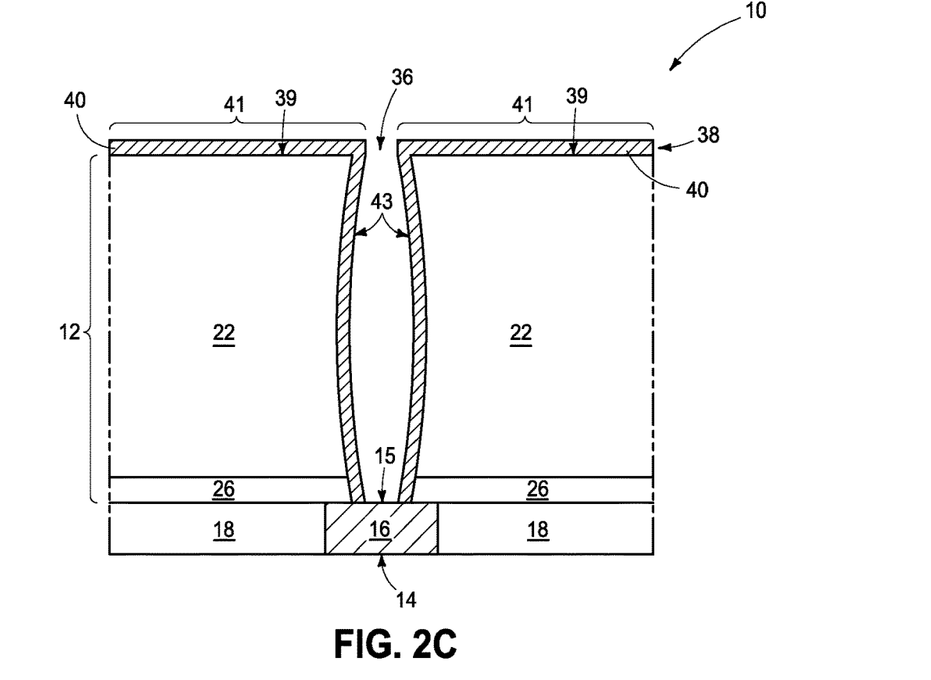

Referring to FIG. 2C, a conductive liner 38 is formed within the opening 36 and over the upper surface 39 of the insulative mass 12. The conductive liner 38 comprises conductive liner material 40. The conductive liner material may comprise any suitable composition(s); and in some embodiments may comprise one or more of the materials described above as being suitable for the liner 306 of FIG. 1A. Accordingly, the liner material 40 may comprise, consist essentially of, or consist of nitrogen in combination with a first metal. In some embodiments, the liner material 40 may comprise one or more of TaSiN, TaN, TiSiN, TiN, WN and WSiN; where the chemical formulas indicate components and not specific stoichiometries. In some embodiments, the liner material 40 may additionally comprise one or both of boron and argon.

The conductive liner 38 narrows the opening 36. The conductive liner has a first portion 41 over the upper surface 39 of the insulative mass 12, and has a second portion 43 within the opening 36.

In the illustrated embodiment, the conductive liner 38 does not cover an entirety of the upper surface 15 of the conductive base structure 14. Such may result from poor coverage of the liner material 40 across the surface 15 at the bottom of the opening 36 (which may occur if the opening 36 has a high aspect ratio). The illustrated embodiment shows the liner 38 in a configuration in which the liner does not entirely cover the bottom of the opening 36 in order to emphasize that the processing described herein is suitable even in applications in which an upper surface of the base 16 remains exposed within the opening 36 after formation of the liner 38. In other embodiments the liner 38 may entirely cover the surface 15 at the bottom of the opening 36.

Figure 2D:
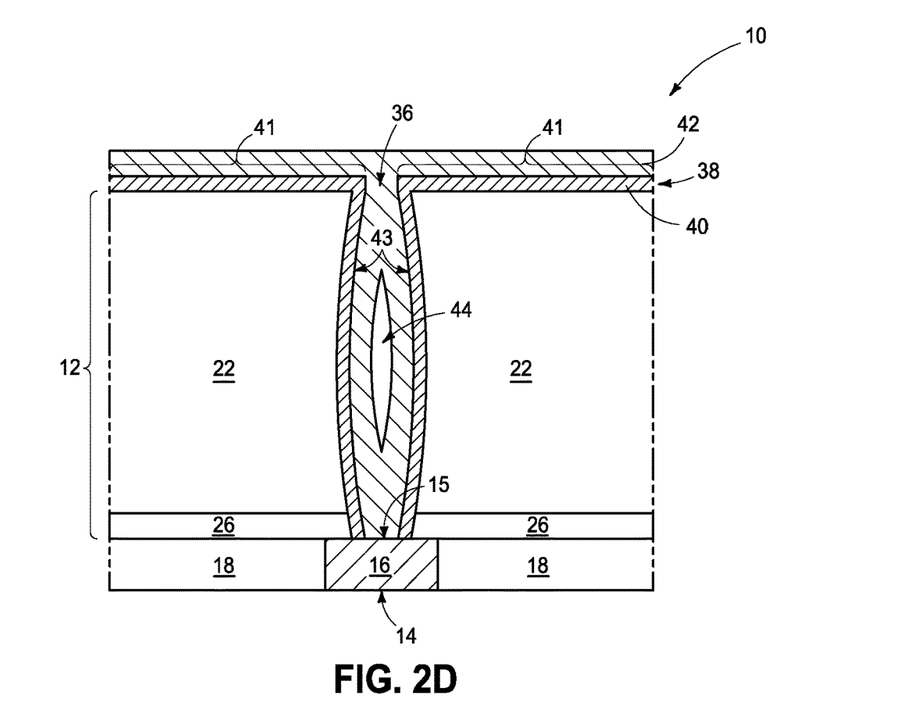

Referring to FIG. 2D, conductive material 42 is formed over the conductive liner 38 and within the narrowed opening 36. The conductive material 42 may comprise, consist essentially of, or consist of one or more metals; and in some embodiments may comprise the same materials described above as being suitable for the metal-containing material 308 of FIG. 1A. The metal within the metal-containing conductive material 42 may be referred to as a second metal to distinguish it from the first metal within the liner 38. The first and second metals may be the same as one another (e.g., may both comprise tungsten), or may be different from one another (e.g., the first metal of the liner 38 may comprise tungsten while the second metal of the conductive material 42 comprises titanium).

The conductive material 42 is shown to poorly fill the opening 36 so that a seam (keyhole, void) 44 remains. In conventional fabrication processes, the seam 44 may be problematic. The processing described herein ultimately opens the seam and then fills it with conductive material to illuminate the seam, and thus may be advantageous relative to conventional fabrication processes.

Figure 2E:
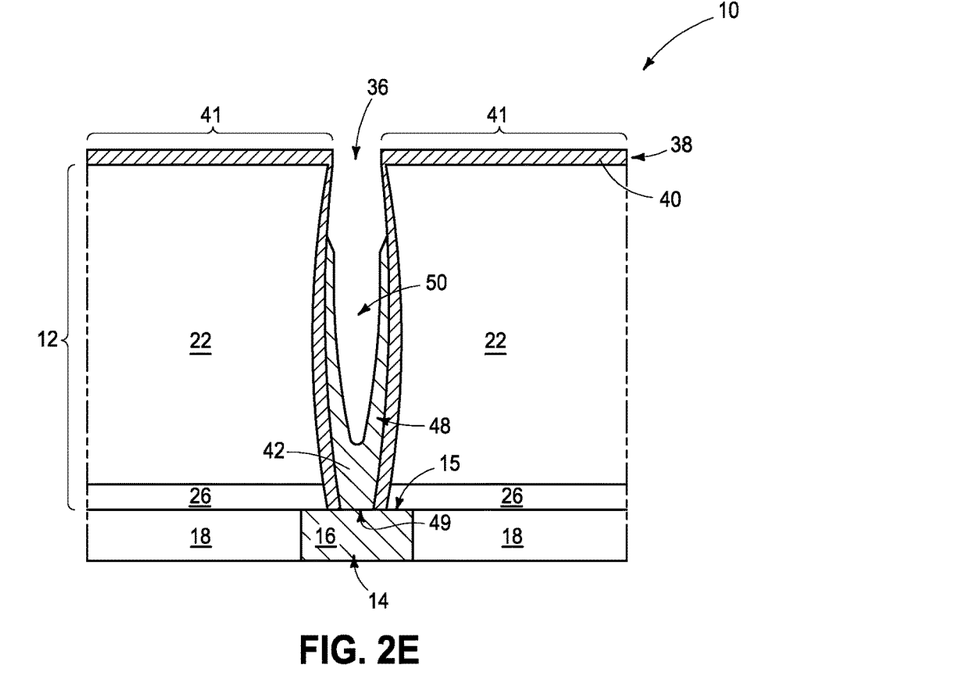

Referring to FIG. 2E, the conductive material 42 is selectively etched relative to the conductive liner 38. Such selective etching may utilize the processing described above relative to FIG. 1B. The selective etching removes the conductive material 42 from over the first portion 41 of the liner 38, while leaving a remaining portion of the conductive material 42 within the opening 36.

The etching of FIG. 2E opens the seam 44 (FIG. 2D), and thus leaves a remaining portion of the conductive material 42 as a container-shaped conductive structure 48. The container-shape of the conductive structure 48 defines an upwardly-opening container 50.

In the shown embodiment, the container structure 48 has a bottom surface 49 which directly contacts the upper surface 15 of the conductive base structure 14.

Figure 2F:
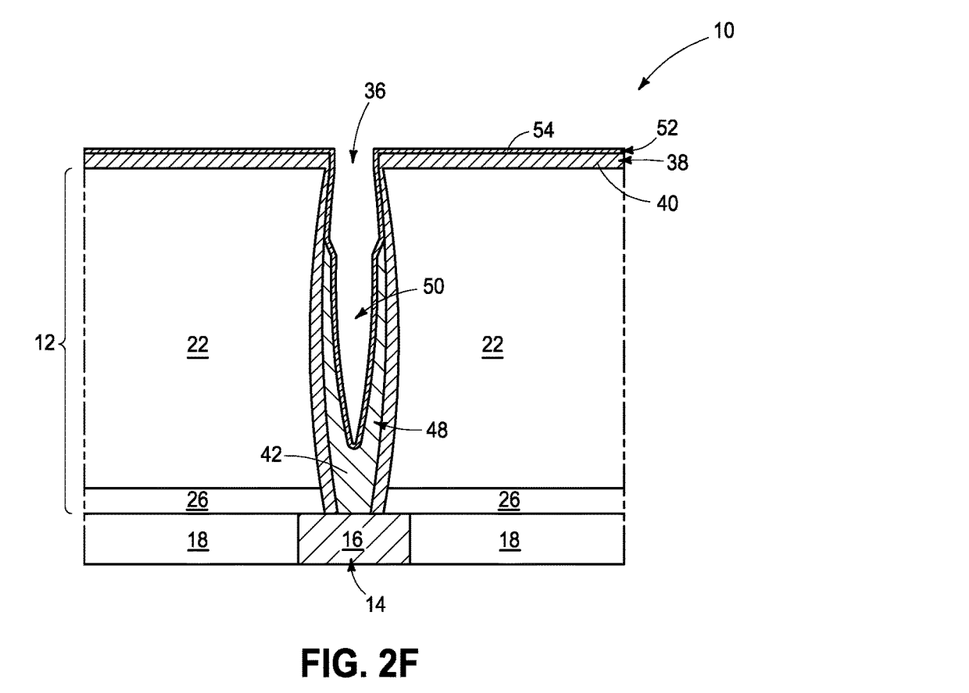

Referring to FIG. 2F, a conductive liner 52 is formed over the liner 38, and within the opening 36. The liner 52 comprises a liner material 54. In some embodiments, the liners 38 and 52 may be referred to as first and second conductive liners, respectively; and the liner materials 40 and 54 may be referred to as first and second conductive liner materials, respectively.

The second liner material 54 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the second liner material 54 may comprise metal and nitrogen, and may comprise any of the compositions described above as being suitable for the first liner material 40. The second liner material 54 may comprise a same composition as the first liner material 40 (e.g., both may comprise tungsten nitride), or may comprise a different composition than the first liner material 40 (e.g., the first liner material 40 may comprise tungsten nitride, and the second liner material 54 may comprise titanium nitride).

The second liner 52 may be omitted in some embodiments.

The second liner 52 narrows the upwardly-opening container 50 of the container-shaped structure 48. In some embodiments, the second liner 52 may be formed very thin, and may, for example, have a thickness of less than or equal to about 10 Å. The second liner 52 may form a uniform surface across the materials 40 and 42 for subsequent deposition of another conductive material (specifically, a conductive material 56 described below with reference to FIG. 2G).

Figure 2G:
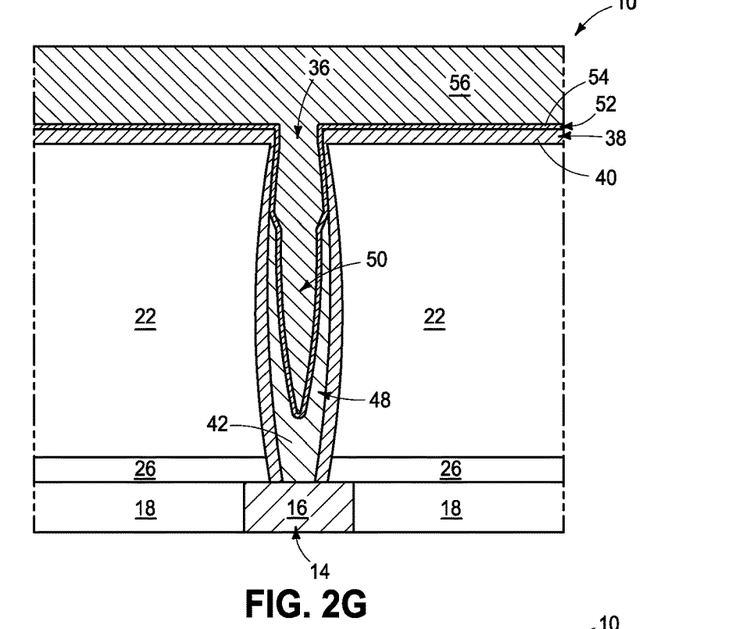

Referring to FIG. 2G, the conductive material 56 is formed over the liner 52 and within the opening 36. The conductive material 56 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 56 may comprise one or more metals and/or metal-containing compositions; and may, for example, comprise, consist essentially of, or consist of one or more of tantalum, titanium, tungsten, tantalum nitride, titanium nitride, tungsten nitride, etc.

Figure 2H:
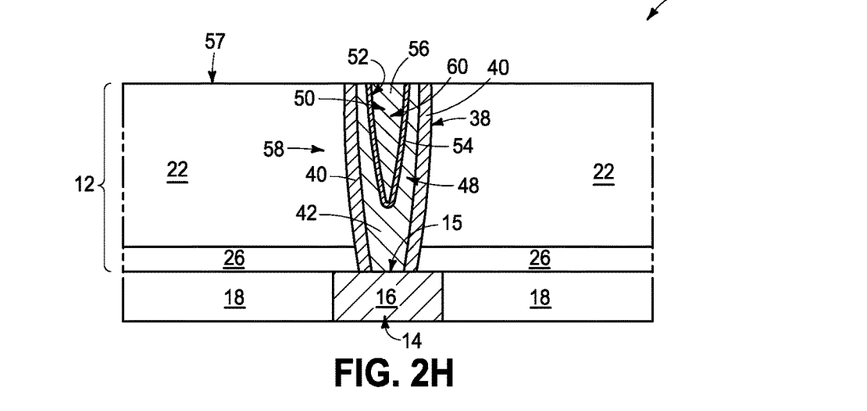

Referring to FIG. 2H, the construction 10 is subjected to planarization (e.g., chemical-mechanical polishing, CMP) to form a planarized upper surface 57 extending across the materials 22, 40, 42, 54 and 56. The materials 40, 42, 54 and 56 together form a conductive interconnect 58 which extends through the insulative mass 12 to the upper surface 15 of the conductive base structure 14. The planarization patterns the conductive material 56 into a conductive plug 60 within the upwardly-opening container 50 of the container-shaped structure 48.

Figure 2H:
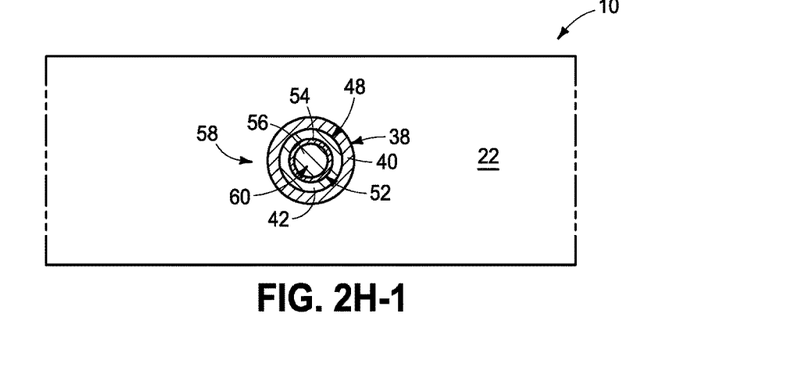

FIG. 2H-1 shows a top view of a region of the assembly 10 at the processing stage of FIG. 2H. The top view of FIG. 2H-1 shows that the conductive liner 38 extends around an outer lateral periphery of the conductive interconnect 58, and laterally surrounds the container-shaped conductive structure 48. In the illustrated embodiment, the conductive interconnect 58 is circular-shaped along the top view of FIG. 2H-1. In other embodiments, the conductive interconnect may have other shapes along the top view of FIG. 2H-1; and, for example, may be square-shaped, rectangular-shaped, elliptical-shaped, etc.

The conductive interconnect 58 may be utilized for electrically coupling circuit components to one another within integrated circuitry. An example application for the conductive interconnect 58 is described with reference to FIG. 3.

Figure 3:
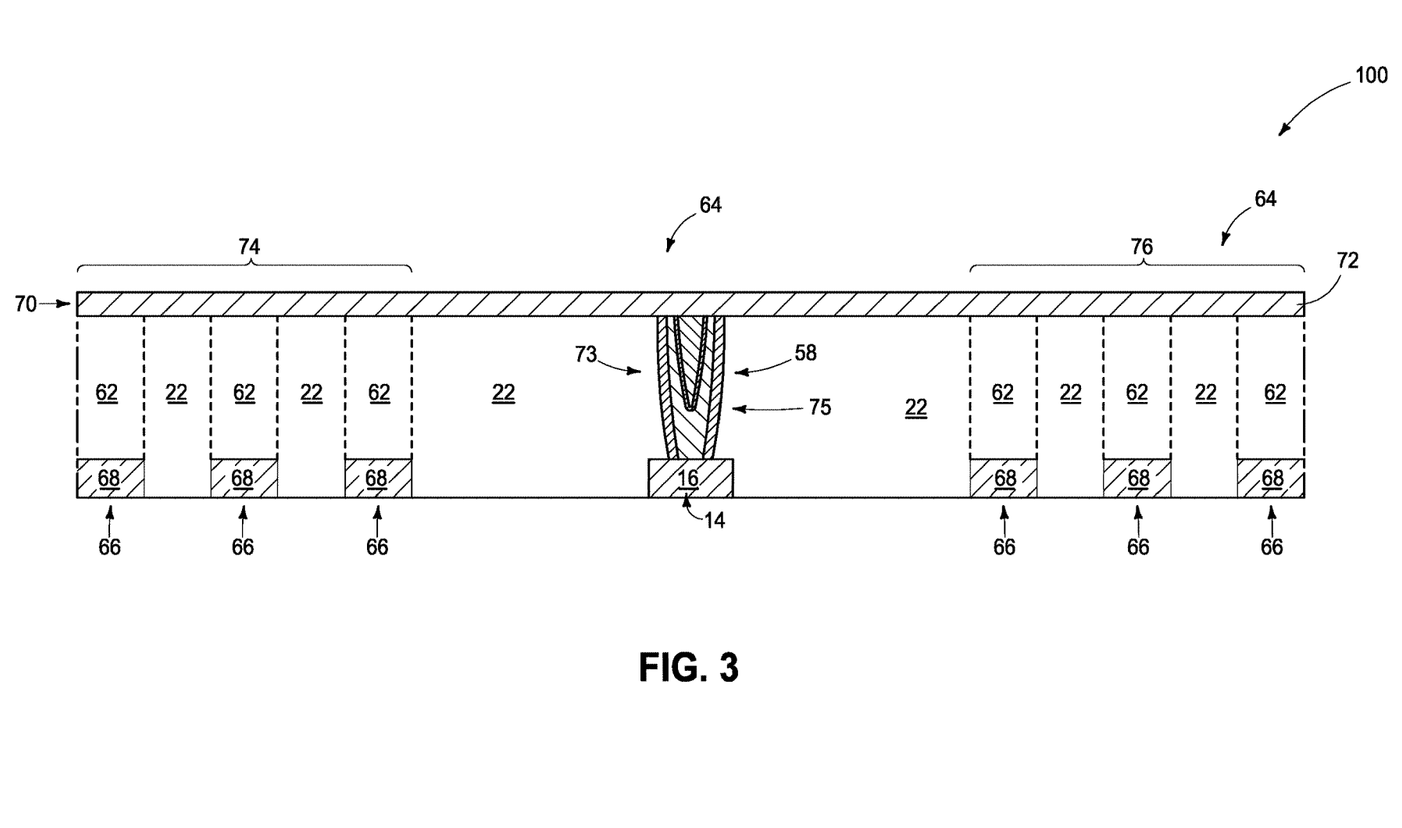
FIG. 3 is diagrammatic cross-sectional side view of an example integrated assembly.

FIG. 3 shows an assembly (arrangement, construction, etc.) 100 which includes memory cells 62 of a memory array 64. The memory cells are diagrammatically illustrated as boxes with dashed boundaries. The memory cells 62 may be any suitable memory cells; and in some embodiments may comprise phase change material (PCM) as programmable material (e.g., may comprise ovonic memory material, and specifically may comprise chalcogenide). For instance, the programmable material may comprise one or more of germanium (Ge), antimony (Sb), tellurium (Te) and indium (In). In specific embodiments, the programmable material may, for example, comprise, consist essentially of, or consist of GeSbTe or InGeTe, where the formulas indicate components rather than designating specific stoichiometries. In some embodiments, the memory cells may comprise programmable material configured to be utilized in self-selecting devices; for example, a chalcogenide material may act both as a storage element and as a select device. The chalcogenide may be utilized alone in the self-selecting devices, or may be utilized in combination with another composition. Example self-selecting PCM devices (with PCM devices being devices comprising phase change material) are described in U.S. Pat. No. 8,847,186 (Redaelli et al.) and U.S. Pat. No. 10,134,470 (Tortorelli et al.), listing Micron Technology, Inc. as the assignee. In some embodiments, the memory cells 62 may comprise the programmable material in combination with select devices, rather than being in self-selecting configurations.

The memory cells 62 are spaced from one another by regions comprising the insulative material 22 (e.g., by regions comprising silicon dioxide).

Wordlines (access lines) 66 extend in and out of the page relative to the cross-sectional view of FIG. 3. The wordlines comprise conductive wordline material 68. The wordline material 68 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

A bitline (sense line, digit line) 70 extends across the memory cells 62, and across the conductive interconnect 58; and extends orthogonally relative to the direction of the wordlines 66. The bitline 70 comprises conductive bitline material 72. The conductive bitline material may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The description of FIG. 3 indicates that the wordlines 66 are under the memory cells 62, and that the bitline 70 is over the memory cells. In other applications, the relative orientation of the wordlines and bitlines may be reversed so that the bitlines are under the memory cells and the wordlines are over the memory cells. The terms "access/sense line", "wordline/bitline", "bitline/wordline" and "sense/access line" may be utilized herein to generically refer to bitlines and wordlines in contexts in which an indicated structure may be either a wordline or a bitline.

The conductive interconnect 58 of FIG. 3 may be considered to comprise, along the cross-section of FIG. 3, a first side 73 and a second side 75 in opposing relation to the first side. The memory cells 62 adjacent (or along) the first side 73 may be considered to correspond to a first set 74 of memory cells of the memory array 64, and the memory cells 62 adjacent (or along) the second side 75 may be considered to correspond to a second set 76 of memory cells of the memory array 64. The bitline 70 is above the memory cells 62 of the first and second sets 74 and 76, and above the conductive interconnect 58; and is electrically coupled with the memory cells 62 of the first and second sets 74 and 76, and with the conductive interconnect 58.

The optional copper-barrier material 26 (FIG. 2A) is not shown in FIG. 3, but may be provided in embodiments in which the base structure 14 comprises copper.

Figure 3A:
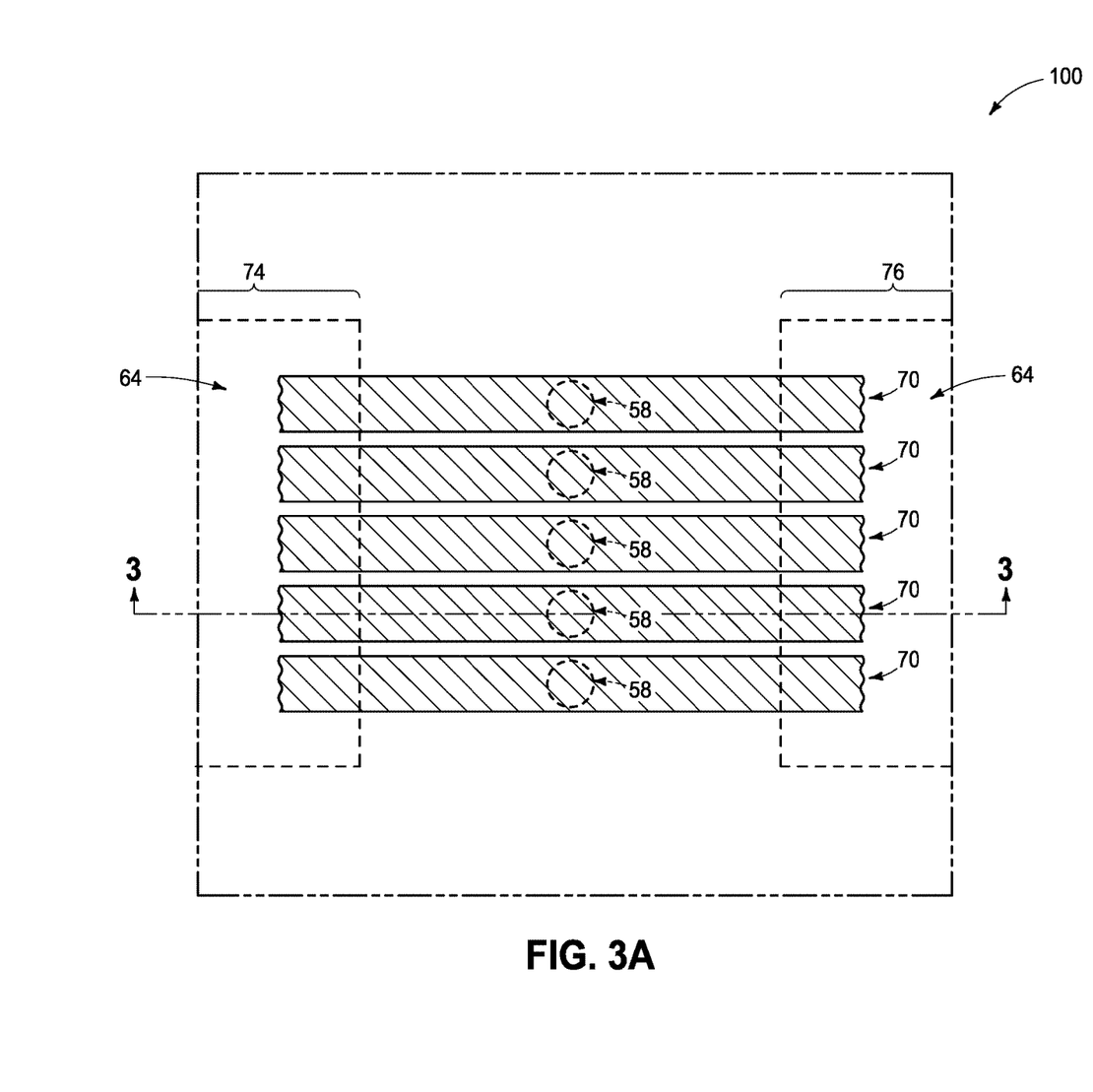
FIG. 3A is diagrammatic top view of the example integrated assembly of FIG. 3. The view of FIG. 3 is along the line 3-3 of FIG. 3A.

FIG. 3A shows a top view of the assembly 100. The view of FIG. 3A is not to scale relative to the view of FIG. 3, and utilizes a different diagrammatic representation of the assembly 100 than is utilized in FIG. 3. Regardless, the cross-section of FIG. 3 may be understood to be generally along the line 3-3 of FIG. 3A.

The top view of FIG. 3A shows that the conductive interconnect 58 of FIG. 3 is one of a plurality of substantially identical conductive interconnects; with the term "substantially identical" meaning identical to within reasonable tolerances of fabrication and measurement. The conductive interconnects are arranged along a line, with such line extending along a direction which would be in and out of the page relative to the plane of the cross-section of FIG. 3.

It is to be understood that even though the cross-section of FIG. 3 only comprises one of the conductive interconnects 58 between the illustrated first and second sets (74, 76) of the memory cells, in other embodiments there may be multiple conductive interconnects formed along the cross-section of FIG. 3. Accordingly, even though FIG. 3A shows a single row of the interconnects 58, in other embodiments there may be multiple rows of such interconnects (e.g., the interconnects 58 may be arranged in a matrix). Also, it is to be understood that the illustrated interconnects 58 of FIG. 3A may be representative of a large number of substantially identical interconnects. For instance, in some embodiments there may be hundreds, thousands, hundreds of thousands, millions, etc., of the conductive interconnects 58.

The bitline 70 of FIG. 3 is one of a plurality of bitlines which are formed across the memory array 64, as can be seen in FIG. 3A. The illustrated bitlines 70 may be representative of a large number of substantially identical bitlines. For instance, in some embodiments there may be hundreds, thousands, hundreds of thousands, millions, etc., of the bitlines 70. Each of the bitlines extends across one of the illustrated conductive interconnects 58 in the illustrated embodiment. The conductive interconnects 58 are shown in dashed view in FIG. 3A to indicate that they are under the bitlines 70.

Figure 4:
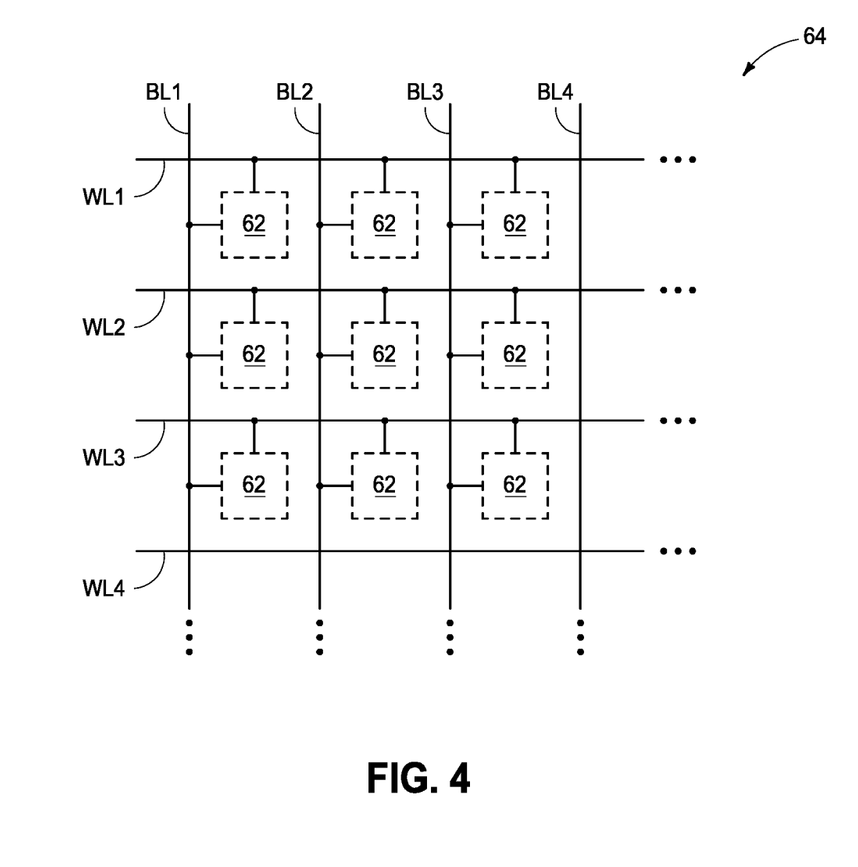
FIG. 4 is a diagrammatic schematic view of an example memory array.

The memory array 64 of FIGS. 3 and 3A may have any suitable configuration. FIG. 4 schematically illustrates an example configuration of the memory array 64. Such configuration includes the memory cells 62 at cross-points where wordlines (WL1-WL4) pass the bitlines (BL1-BL4). Each of the memory cells is uniquely addressed through a combination of one of the wordlines and one of the bitlines.

Figure 5:
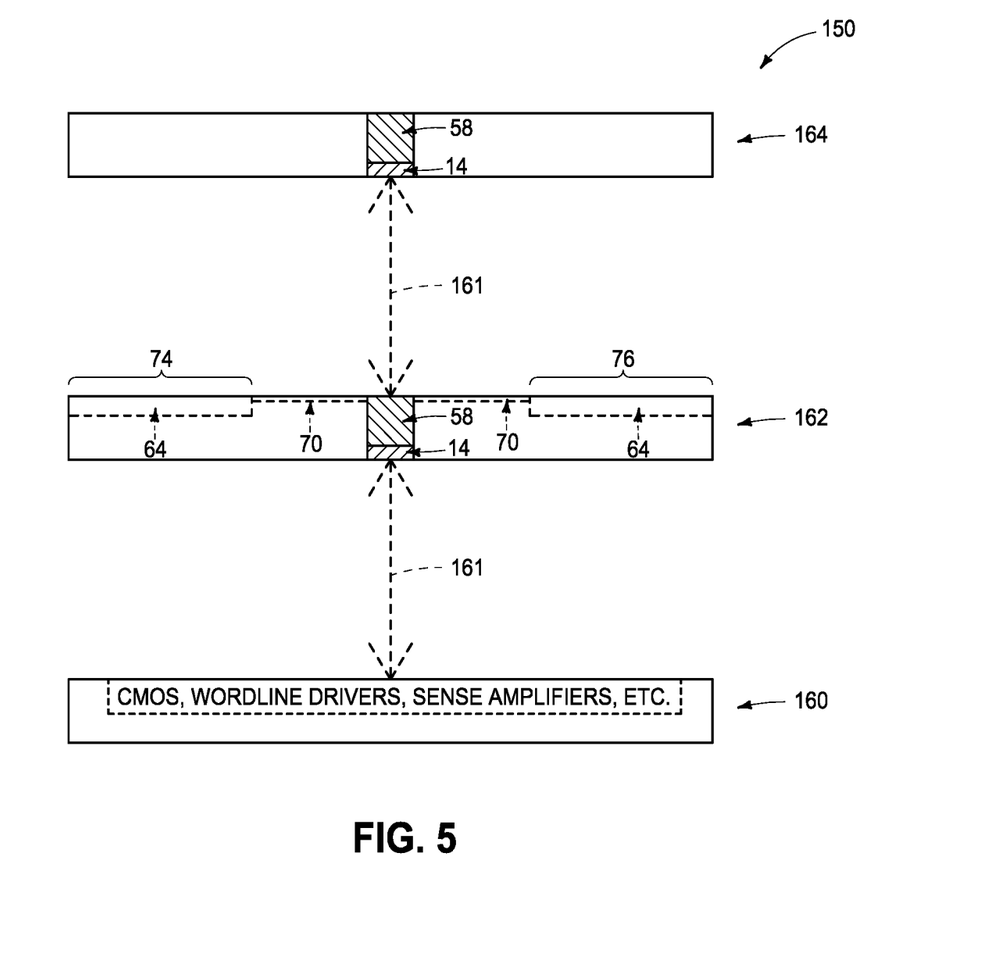
FIG. 5 is diagrammatic cross-sectional side view of an example multitier assembly.

The conductive interconnects 58 of FIGS. 3 and 3A may be utilized to enable circuitry from one tier to be electrically coupled with circuitry of another tier within a multitier stack. For instance, FIG. 5 shows a multitier stack 150 having three tiers 160, 162 and 164 in a vertical stack. The vertically-stacked arrangement of FIG. 5 may extend upwardly to include additional tiers. The tiers 160, 162 and 164 may be considered to be examples of levels that are stacked one atop the other. The levels may be within different semiconductor dies (wafers), or at least two of the levels may be within the same semiconductor die. The bottom tier 160 may include control circuitry and/or sensing circuitry (e.g., may include wordline drivers, sense amplifiers, etc.; and may include CMOS circuitry, as shown). The upper tiers 162 and 164 may include memory arrays, such as, for example, the memory array 64 of FIGS. 3 and 3A. The memory arrays within the various tiers may be the same as one another (e.g., may all be arrays of PCM devices), or may be different relative to one another (e.g., some may be arrays of PCM devices, while others are not). Also, one or more of the upper tiers may include control circuitry or other logic circuitry.

The conductive interconnects 58 are illustrated as enabling connection from circuitry of the tiers 162 and 164 to the circuitry of the tier 160, with such connections being diagrammatically shown utilizing dashed arrows 161. A sense/access line 70 associated with a memory array 64 within the tier 162 (which may be referred to as a memory tier) may be electrically coupled with circuitry associated with the tier 160 through the connection 161. For instance, a bitline associated with the memory array 64 may be electrically coupled with a sense amplifier within the tier 160 through the connection 161. As another example, a wordline associated with the memory array 64 may be electrically coupled with a wordline driver within the tier 160 through the connection 161.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having an insulative mass over a conductive base structure. A conductive interconnect extends through the insulative mass to an upper surface of the conductive base structure. The conductive interconnect includes a conductive liner extending around an outer lateral periphery of the interconnect. The conductive liner includes nitrogen in combination with a first metal. A container-shaped conductive structure is laterally surrounded by the conductive liner. The container-shaped conductive structure includes a second metal. A conductive plug is within the container-shaped conductive structure.

Some embodiments include an integrated assembly which includes a first tier having a memory array and a conductive interconnect. The conductive interconnect passes through an insulative mass and is directly against an upper surface of a conductive base structure. The conductive interconnect includes a liner material and a container-shaped conductive structure, with the liner material laterally surrounding the container-shaped conductive structure. The container-shaped conductive structure defines an upwardly-opening container. The conductive interconnect includes a conductive plug within the upwardly-opening container. A sense/access line is within the first tier and is electrically coupled with memory cells of the memory array and with the conductive interconnect. A second tier is vertically offset from the first tier and includes circuitry which is electrically coupled to the sense/access line through the conductive interconnect.

Some embodiments include a method of forming an integrated assembly. A construction is formed which includes an insulative mass over a conductive base structure. An opening is formed to extend through the insulative mass to expose an upper surface of the conductive base structure. A conductive liner is formed within the opening and over an upper surface of the insulative mass. The conductive liner comprises nitrogen in combination with a first metal. The conductive liner narrows the opening. A conductive material is formed over the conductive liner and within the narrowed opening. The conductive material comprises a second metal. The conductive material is selectively etched relative to the conductive liner to remove the conductive material from over the upper surface of the insulative mass while leaving a remaining portion of the conductive material within the narrowed opening. The remaining portion of the conductive material is a container-shaped conductive structure within the narrowed opening. The container-shaped conductive structure defines an upwardly-opening container. A conductive plug is formed within the upwardly-opening container.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:
1. An integrated assembly, comprising:
  a first tier which includes a memory array and a conductive interconnect; the conductive interconnect passing through an insulative mass and being directly against an upper surface of a conductive base structure; the conductive interconnect including a liner material and a container-shaped conductive structure, with the liner material laterally surrounding the container-shaped conductive structure; the container-shaped conductive structure defining an upwardly-opening container; the conductive interconnect comprising a conductive plug within the upwardly-opening container; a sense/access line being within the first tier and being electrically coupled with memory cells of the memory array and with the conductive interconnect; and a second tier vertically spaced from the first tier and comprising circuitry which is electrically coupled to the sense/access line through the conductive interconnect.

2. The integrated assembly of claim 1 wherein the conductive interconnect is one of many substantially identical conductive interconnects.

3. The integrated assembly of claim 2 wherein the sense/access line is one of many substantially identical sense/access lines.

4. The integrated assembly of claim 1 wherein the conductive base structure comprises tungsten or copper.

5. The integrated assembly of claim 1 wherein the liner material is a first liner material, and further comprising a second liner material within the upwardly-opening container and narrowing the upwardly-opening container; the conductive plug being within the narrowed upwardly-opening container.

6. The integrated assembly of claim 5 wherein the second liner material comprises a same composition as the first liner material.

7. The integrated assembly of claim 5 wherein the second liner material comprises a different composition than the first liner material.

8. The integrated assembly of claim 1 wherein:
the liner material comprises nitrogen in combination with a first metal; and
the container-shaped structure comprises a second metal.

9. The integrated assembly of claim 8 wherein the first and second metals are the same as one another.

10. The integrated assembly of claim 9 wherein the first and second metals are tungsten.

11. The integrated assembly of claim 10 wherein the conductive plug comprises tungsten.

12. The integrated assembly of claim 8 wherein the first and second metals are different from one another.

13. The integrated assembly of claim 1 wherein:
the second tier is beneath the first tier;
the sense/access line is one of a bitline or a wordline; and
the circuitry includes one of a sense amplifier circuitry electrically coupled to the bitline through the conductive interconnect or a wordline driver circuitry electrically coupled to the wordline through the conductive interconnect.

14. The integrated assembly of claim 1 wherein the liner material comprises one or more of TaSiN, TaN, TiSiN, TiN, WN and WSiN, where the chemical formulas indicate components and not specific stoichiometries.

15. The integrated assembly of claim 1 wherein the memory cells comprise phase change material as programmable material.

16. The integrated assembly of claim 15 wherein the programmable material comprises chalcogenide.

17. The integrated assembly of claim 16 wherein the chalcogenide comprises a storage element and a select device.

18. The integrated assembly of claim 15 wherein the programmable material comprises one or more of germanium, antimony, tellurium and indium.

19. The integrated assembly of claim 1 wherein the memory cells comprise programmable material in combination with select devices.

20. The integrated assembly of claim 1 wherein the memory cells comprise programmable material in combination with self-selecting configurations.

21. The integrated assembly of claim 1 wherein the liner material comprises one or more of boron and argon.

22. The integrated assembly of claim 1 wherein the first tier is in a first semiconductor die and the second tier is in a second semiconductor die different from the first semiconductor die.

* * * * *